United States Patent
Soltani et al.

(10) Patent No.: US 11,795,576 B2
(45) Date of Patent: Oct. 24, 2023

(54) PRODUCTION METHOD OF SILICON CARBIDE WAFER, PRODUCTION METHOD OF SEMICONDUCTOR SUBSTRATE, AND PRODUCTION METHOD OF SILICON CARBIDE SEMICONDUCTOR DEVICE

(71) Applicant: DENSO CORPORATION, Kariya (JP)

(72) Inventors: Bahman Soltani, Kariya (JP); Kazutoshi Sasayama, Kariya (JP); Yasushi Hibi, Kariya (JP)

(73) Assignee: DENSO CORPORATION, Kariya (JP)

( * ) Notice: Subject to any disclaimer, the term of this patent is extended or adjusted under 35 U.S.C. 154(b) by 399 days.

(21) Appl. No.: 17/211,962

(22) Filed: Mar. 25, 2021

(65) Prior Publication Data

US 2021/0301420 A1 Sep. 30, 2021

(30) Foreign Application Priority Data

Mar. 31, 2020 (JP) ................................. 2020-063149

(51) Int. Cl.
*C30B 29/36* (2006.01)
*C30B 33/02* (2006.01)
*C30B 23/02* (2006.01)
*H01L 29/16* (2006.01)

(52) U.S. Cl.
CPC ............. *C30B 29/36* (2013.01); *C30B 33/02* (2013.01); *C30B 23/02* (2013.01); *H01L 29/1608* (2013.01)

(58) Field of Classification Search
CPC ......... C30B 23/02; C30B 29/36; C30B 33/00; C30B 33/02; H01L 29/1608
See application file for complete search history.

(56) References Cited

U.S. PATENT DOCUMENTS

2018/0085851 A1* 3/2018 Hirata ................ B23K 26/0823
2022/0379520 A1* 12/2022 Yamamoto ........... B23K 20/002

FOREIGN PATENT DOCUMENTS

| EP | 2420598 A1 | 2/2012 |
|---|---|---|
| JP | H11-079896 A | 3/1999 |
| JP | 2004-039808 A | 2/2004 |
| JP | 2009-102196 A | 5/2009 |
| JP | 2014-101129 A | 6/2014 |
| JP | 6334253 B2 | 5/2018 |
| WO | WO-2018/183585 A1 | 10/2018 |

* cited by examiner

*Primary Examiner* — Jaehwan Oh
(74) *Attorney, Agent, or Firm* — Harness, Dickey & Pierce, P.L.C.

(57) ABSTRACT

Provided is a production method of a SiC wafer which can increase the yield of a SiC wafer which can be prepared from a produced SiC single crystal ingot and the product yield of a semiconductor chip.

In forming cylindrical column parts from a SiC single crystal ingot, the diameters of the cylindrical column parts are gradually changed. Specifically, the SiC single crystal ingot configured to have a frustoconical shape is made into, instead of cylindrical column parts all having identical diameters, cylindrical column parts whose diameters increase from the upper surface toward the lower surface of the SiC single crystal ingot.

10 Claims, 10 Drawing Sheets

- PRODUCING SiC SINGLE CRYSTAL INGOT
- PRODUCING SiC WAFER BY REPEATING GRINDING STEP AND SLICING STEP
- STEP OF STICKING SiC SUPPORT SUBSTRATE TO BACK SURFACE
- FORMING SEMICONDUCTOR SUBSTRATE AS WAFER MAKE
- FORMING EPILAYER
- SEMICONDUCTOR PROCESS TO FRONT SURFACE SIDE OF SEMICONDUCTOR SUBSTRATE
- STEP OF STICKING SURFACE SUPPORT SUBSTRATE
- REMOVING SiC SUPPORT SUBSTRATE
- GRINDING AND POLISHING BACK SURFACE OF SEMICONDUCTOR SUBSTRATE
- FORMING BACK SURFACE ELECTRODE
- STEP OF PEELING SURFACE SUPPORT SUBSTRATE
- SEPARATING INTO PIECES BY DICING

- PRODUCING SiC SINGLE CRYSTAL INGOT
- PRODUCING SiC WAFER BY COLLECTIVE GRINDING STEP AND SLICING STEP WITH WIRE
- FORMING SEMICONDUCTOR SUBSTRATE AS WAFER MAKE
- FORMING EPILAYER
- SEMICONDUCTOR PROCESS TO FRONT SURFACE SIDE OF SEMICONDUCTOR SUBSTRATE
- STEP OF STICKING SURFACE SUPPORT SUBSTRATE
- GRINDING AND POLISHING BACK SURFACE OF SEMICONDUCTOR SUBSTRATE
- FORMING BACK SURFACE ELECTRODE
- STEP OF PEELING SURFACE SUPPORT SUBSTRATE
- SEPARATING INTO PIECES BY DICING

- PRODUCING SiC SINGLE CRYSTAL INGOT
- PRODUCING SiC WAFER BY COLLECTIVE GRINDING STEP AND SLICING STEP WITH LASER
- FORMING SEMICONDUCTOR SUBSTRATE AS WAFER MAKE
- FORMING EPILAYER
- SEMICONDUCTOR PROCESS TO FRONT SURFACE SIDE OF SEMICONDUCTOR SUBSTRATE
- STEP OF STICKING SURFACE SUPPORT SUBSTRATE
- GRINDING AND POLISHING BACK SURFACE OF SEMICONDUCTOR SUBSTRATE
- FORMING BACK SURFACE ELECTRODE
- STEP OF PEELING SURFACE SUPPORT SUBSTRATE
- SEPARATING INTO PIECES BY DICING

PRODUCTION METHOD OF SILICON CARBIDE WAFER, PRODUCTION METHOD OF SEMICONDUCTOR SUBSTRATE, AND PRODUCTION METHOD OF SILICON CARBIDE SEMICONDUCTOR DEVICE

CROSS-REFERENCE TO RELATED APPLICATION

This application is based on and claims the benefit of priority from earlier Japanese Patent Application No. 2020-63149 filed Mar. 31, 2020, the entire contents of which is incorporated herein by reference.

BACKGROUND OF THE INVENTION

Technical Field of the Invention

The present disclosure relates to a production method of a silicon carbide wafer, a production method of a semiconductor substrate, and a production method of a silicon carbide semiconductor device.

Related Art

SiC has been known as a semiconductor material usable as a material of a power MOSFET or the like. A SiC wafer is obtained by growing a SiC single crystal ingot by a sublimation recrystallization method or the like and thereafter slicing the grown product. For example, a SiC single crystal can be produced by sublimating a SiC powdered material by disposing a seed crystal on a lid body at the top of a graphite crucible inside the crucible while heating a SiC powdered material placed on the crucible bottom at high temperature, and supplying the sublimate gas onto the seed crystal surface for recrystallization. At this time, the SiC single crystal grows while increasing in diameter. Therefore, a SiC single crystal ingot having a frustoconical shape is obtained by disposing a skirt part which gradually increases in diameter from the lid body on which a seed crystal is disposed toward the crucible bottom side, and growing the SiC single crystal along the skirt part.

Slicing the SiC single crystal ingot obtained in this manner is performed after cutting the outer circumferential surface of the ingot into a cylindrical shape.

SUMMARY

A production method of a silicon carbide wafer according to an aspect of the present disclosure is a production method of a silicon carbide wafer to produce a silicon carbide wafer by slicing a silicon carbide single crystal ingot, including:
forming a plurality of stages of cylindrical column parts having different diameters which increase from the upper surface toward the lower surface, by removing an outer edge portion of a silicon carbide single crystal ingot having a frustoconical shape through grinding processing of the silicon carbide single crystal ingot; and
slicing the cylindrical part into the silicon carbide wafer.

It is noted that a parenthesized reference sign assigned to each constituent or the like indicates an example of a correspondence relation between the constituent or the like and a specific constituent or the like described in a later-described embodiment.

DETAILED DESCRIPTION OF THE PREFERRED EMBODIMENTS

Hereinafter, an example of an embodiment according to the present disclosure will be described in detail with reference to the drawings. It is noted that in the drawings, each member is appropriately exaggerated in size for simplification of description, and an actual proportion and size of each member are not illustrated. For portions that are mutually the same as or equivalent to each other among the following embodiments, the same reference sign is assigned for description.

The present inventors conducted research on a method that can increase the yield of a SiC wafer which can be prepared from a produced SiC single crystal ingot and the product yield of a semiconductor chip.

As described above, slicing a SiC single crystal ingot is performed after cutting the outer circumferential surface of the ingot into a cylindrical shape. For example, JP 2015-220265 A discloses a technology of cylindrically grinding a side surface of a SiC single crystal ingot into a cylindrical shape. In this literature, cutting is performed from one end surface of a SiC single crystal ingot using a ring-like grindstone in a process of processing a SiC single crystal ingot into a cylindrical shape, because ingot cracking occurs from the periphery of a SiC single crystal ingot toward the center of the crystal. Specifically, an end surface of a ring-like grindstone is abutted against an upper surface or a bottom surface of a SiC single crystal ingot, and the ring-like grindstone is rotated relative to the SiC single crystal ingot while moving the ring-like grindstone in the ring central axis direction. Accordingly, the surface of the SiC single crystal ingot is ground by the end surface of the ring-like grindstone into a cylindrical shape.

However, when a SiC single crystal ingot has a cylindrical shape, large portions of the outer edge portion of the SiC single crystal ingot which originally had a frustoconical shape comes are removed. This lowers the usage efficiency of a SiC material and decreases the yield of a SiC wafer which can be prepared from a produced SiC single crystal ingot and the product yield of a semiconductor chip.

In view of the above-described circumstances, an object of the present disclosure is to provide a production method of a SiC wafer and a production method of a SiC semiconductor device, which can increase the yield of a SiC wafer and the product yield of a semiconductor chip which can be prepared from a produced SiC single crystal ingot.

For achieving the above-described object, a production method of a silicon carbide wafer according to a mode of the present disclosure is a production method of a silicon carbide wafer to produce a silicon carbide wafer (83) by slicing a silicon carbide single crystal ingot (80), including:

preparing the silicon carbide single crystal ingot having a frustoconical shape which includes an upper surface and a lower surface with a diameter larger than the upper surface;

forming a plurality of stages of cylindrical column parts (81, 82) having different diameters which increase from the upper surface toward the lower surface, by removing an outer edge portion of the silicon carbide single crystal ingot having the frustoconical shape through grinding processing of the silicon carbide single crystal ingot; and slicing the cylindrical column part into the silicon carbide wafer.

According to the above-described embodiment, in forming cylindrical column parts from a SiC single crystal ingot (silicon carbide single crystal ingot) through grinding processing, the diameters of the cylindrical column parts are gradually changed. Specifically, a SiC single crystal ingot configured to have a frustoconical shape is made into, instead of cylindrical column parts all having identical diameters, cylindrical column parts whose diameters increase from the upper surface toward the lower surface of the SiC single crystal ingot. Therefore, the ratio usable as a SIC wafer (silicon carbide wafer) in a SiC single crystal ingot, that is, the usage efficiency of a SiC material, can be increased. Thus, the yield of a SiC wafer which can be prepared from a produced SiC single crystal ingot can be increased. Furthermore, since the diameters of the SiC wafers can be gradually increased, the effective area in the SiC wafer where a semiconductor element can be formed can be widened. This can also increase the product yield of a semiconductor chip.

First Embodiment

A production method of a SiC wafer, a production method of a semiconductor substrate, and a production method of a SiC semiconductor device according to a first embodiment of the present disclosure will be described.

First, before producing a SiC wafer, a SiC single crystal ingot used for producing a SiC wafer is prepared. The SiC single crystal ingot is produced using a SiC single crystal production apparatus illustrated in FIG. 1.

Figure 1:
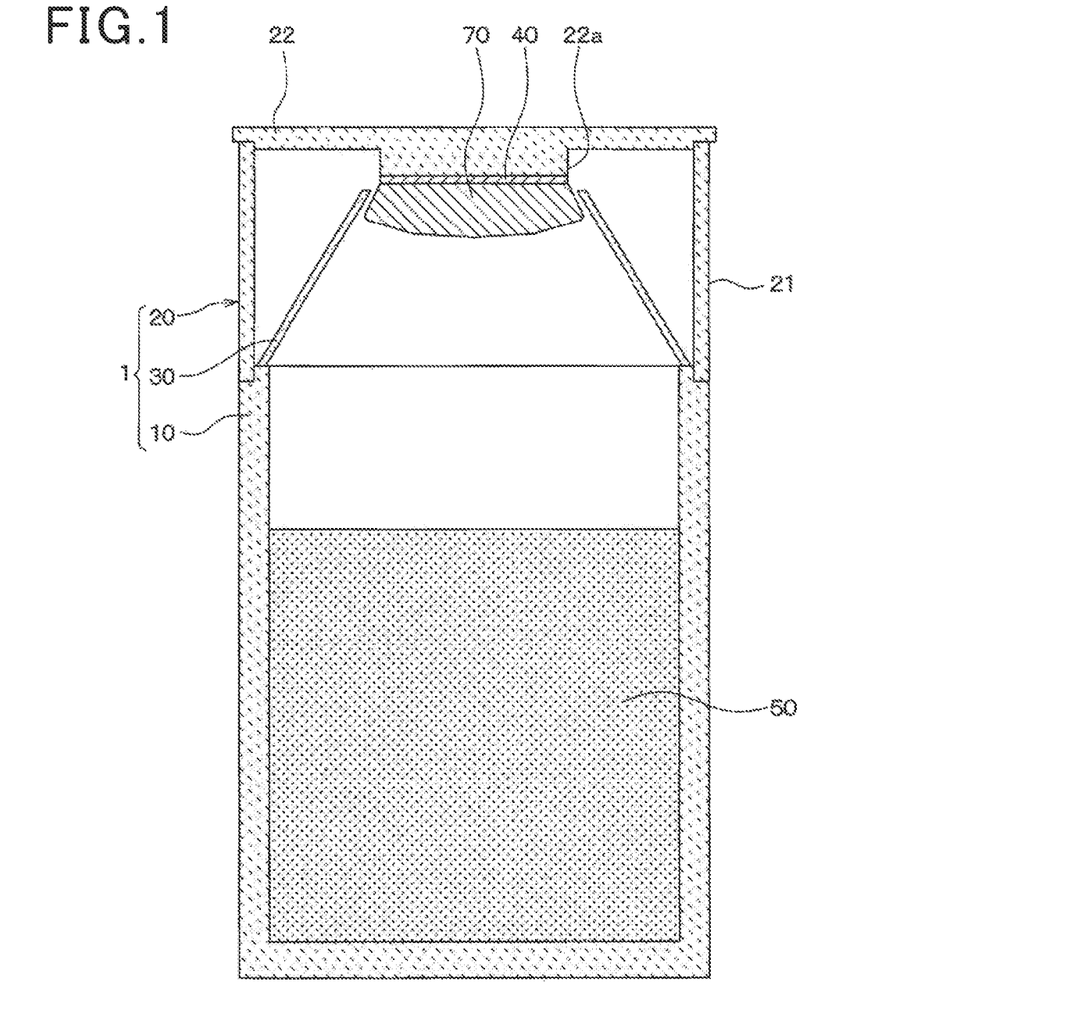
FIG. 1 is a cross-sectional view of a SIC single crystal production apparatus used for producing a SiC single crystal ingot according to a first embodiment.

As illustrated in FIG. 1, a SiC single crystal production apparatus includes a graphite crucible 1 including a container body 10 having a cylindrical shape with a bottom, a lid body 20 having a circular shape, and a skirt part 30 formed in a hollow frustoconical shape. A seed crystal 40 is adhered to the lid body 20, and a powdered material 50 of SiC to serve as a supply source of sublimate gas is disposed in the container body 10. It is configured such that sublimate gas from the powdered material 50 is re-crystallized on the surface of the seed crystal 40 to grow a SiC single crystal 70 on the surface of the seed crystal 40.

The lid body 20 includes a side wall 21 having a cylindrical shape and a lid 22 having a circular plate-like shape to close one of the openings of the side wall 21. The lid 22 includes a protrusion 22a having a cylindrical shape. It is configured that the seed crystal 40 of SIC having a circular shape, for example, is adhered to the tip position of the protrusion 22a.

The skirt part 30 is formed in a frustoconical shape which extends from the seed crystal 40 toward the growth direction in a tapered manner. This skirt part 30 functions to enlarge the diameter of the grown crystal.

It is noted that an unillustrated heating coil is disposed in such a manner as to surround the outer circumference of the crucible 1. It is configured that the heating coil heats the crucible 1 to sublimate the powdered material 50, and the sublimate gas can be supplied onto the surface of the seed crystal 40. Also, the crucible 1 is configured to be thermally insulated by being housed in an unillustrated heating chamber and surrounded by a heat insulating material or the like.

The SiC single crystal production apparatus configured as described above is prepared. Then, the seed crystal 40 is adhered to the tip of the protrusion 22a of the lid 22, and the powdered material 50 is disposed in the container body 10. Thereafter, the crucible 1 is placed in an unillustrated heating chamber, and heating by a heating coil is performed. Then, the crucible 1 is heated by induction heating such that the temperature inside the crucible 1 becomes a prescribed temperature.

Also, a mixed gas of inert gas such as Ar, hydrogen, nitrogen to serve as a dopant of a crystal, and the like is introduced as the atmosphere inside the heating chamber.

The ambient pressure in the heating chamber is made near atmospheric pressure to suppress sublimation of the powdered material 50, until the temperature of the growth surface of the seed crystal 40 and the temperature of the powdered material 50 of SiC are raised to their target temperatures. When the target temperatures have been reached, a vacuum is created. For example, the temperature of the powdered material 50 is 2100 to 2300° C., and the temperature of the growth crystal surface is about 10 to 200° C. lower than that of the powdered material 50. Also, the vacuum atmosphere is, for example, at 1.33 Pa to 6.67 kPa (0.01 to 50 Torr).

Figure 2:
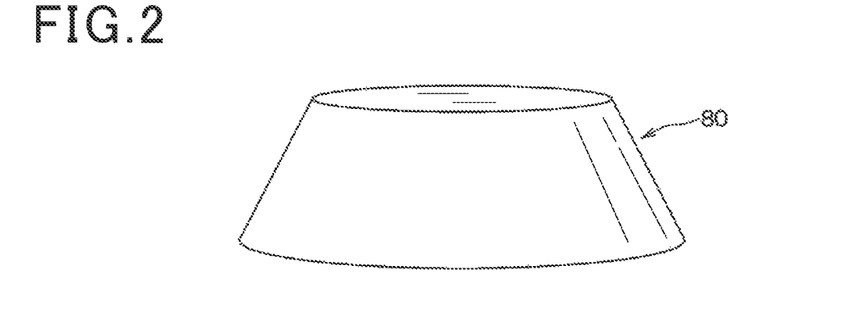
FIG. 2 is a perspective view of a SiC single crystal ingot.

In this manner, the powdered material 50 sublimes when the powdered material 50 is heated, and sublimate gas is generated from the powdered material 50. This sublimate gas is supplied to the seed crystal 40. Accordingly, the sublimate gas is supplied to the surface of the seed crystal 40, and the SiC single crystal 70 grows. At this time, the SiC single crystal 70 grows along the inner wall surface of the skirt part 30. Therefore, the SiC single crystal 70 grows while increasing in diameter and becomes a SiC single crystal ingot having a frustoconical shape. Thereafter, the heating of the crucible 1 by a heating coil is terminated to lower the temperature inside the heating chamber. Then, the SiC single crystal ingot is peeled from the protrusion 22a. Accordingly, there is obtained a SiC single crystal ingot 80 having a frustoconical shape as illustrated in FIG. 2. For example, there can be obtained a SiC single crystal ingot 80 in which the diameter of one end surface at the small diameter side is φ150 equivalent to about 6 inches, the diameter of one end surface at the large diameter side is φ185 to 200 equivalent to about 8 inches, and the height of a part usable for obtaining SiC wafers is about 50 to 80 mm.

It is noted that a SiC single crystal ingot has been prepared by manufacturing it in the above-described mode. However, the present disclosure is not limited to the above-described mode, and a SiC single crystal ingot may be prepared by, for example, purchasing it.

Thereafter, a predetermined production process is performed to produce a SiC wafer from the SiC single crystal ingot 80. With the produced SiC wafer, a semiconductor substrate is produced. Also, with the semiconductor substrate, a SiC semiconductor device is produced. Hereinafter, a production method of a SiC wafer and a production method of a SiC semiconductor device will be described with reference to the flowchart of a production process illustrated in FIG. 3 and the drawings indicating states during the process illustrated in FIG. 4 to FIG. 10.

Figure 3:
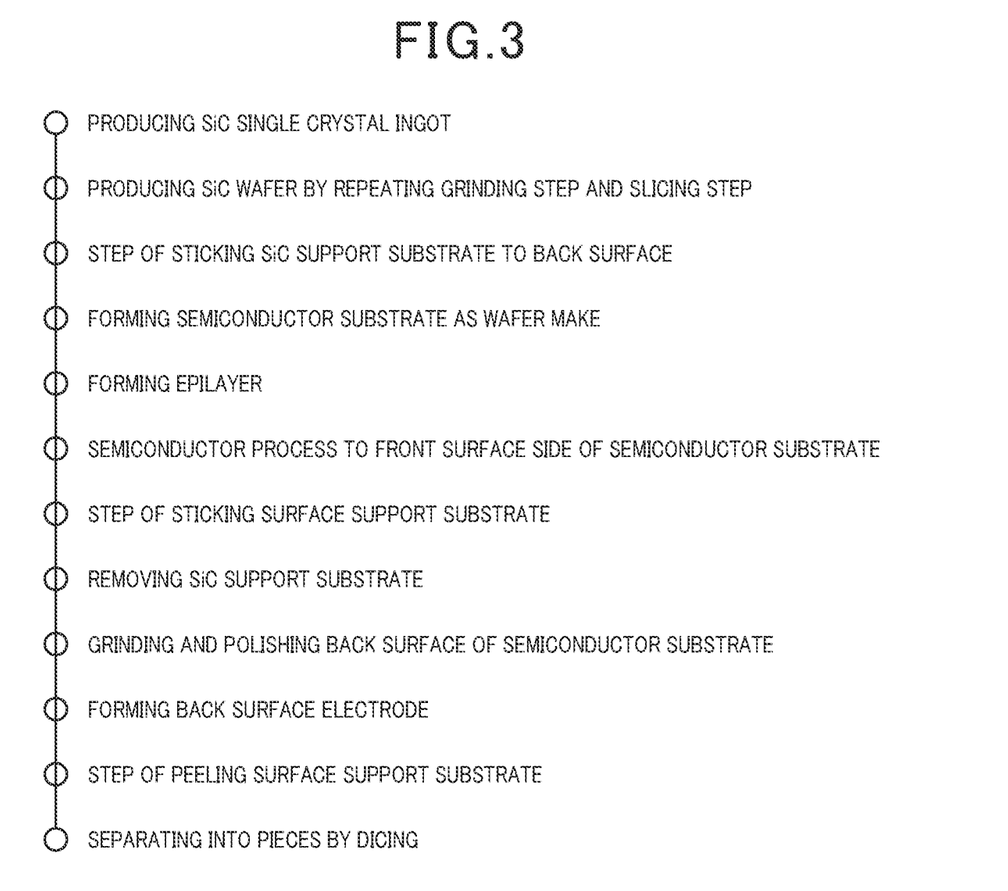
FIG. 3 is a flowchart illustrating a production process of a semiconductor device.
Figure 4:
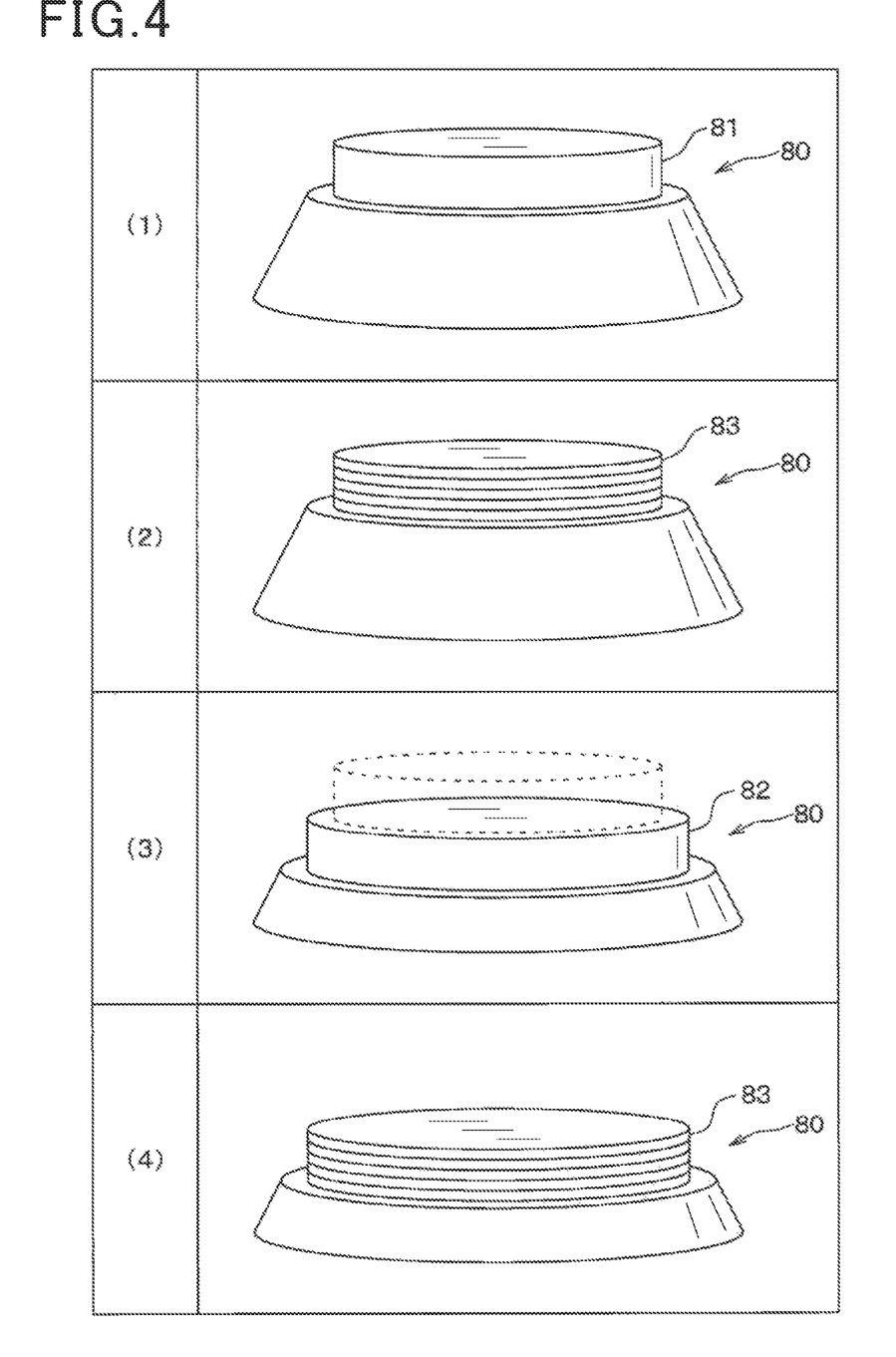
FIG. 4 is a view illustrating a state of a SiC single crystal ingot during a production process of a SiC wafer in a production process of a semiconductor device.

The production method of a SiC wafer, the production method of a semiconductor device, and the production method of a SiC semiconductor device are accomplished by sequentially performing the production process illustrated in FIG. 3. First, as the production step of the SiC single crystal ingot 80 illustrated in FIG. 3, the SiC single crystal ingot 80 is prepared in the above-described manner. Then, the production step of a SiC wafer is performed by performing a grinding step of grinding the outer edge portion of the SiC single crystal ingot 80 into a cylindrical shape and a slicing step of cutting out a SiC wafer. Various techniques are applicable as the grinding step and the slicing step. In the present embodiment, multistage processing is used in which the grinding step and the slicing step are alternately repeated multiple times. While repeating the grinding step multiple times, the outer shapes of the cylindrical shapes become gradually increased. Accordingly, the diameters of SiC wafers that can be obtained are configured to be gradually increased from the upper surface side toward the lower surface side of the SiC single crystal ingot 80. The number of times of the multistage processing is optional. For example, three-stage processing of repeating three times or five-stage processing of repeating five times are performed. FIG. 4 illustrates an example in which three-stage processing is performed.

In the first grinding step, cylindrical grinding processing with a cylindrical grindstone is performed thereby to form a cylindrical column part in a portion of the SiC single crystal ingot 80 having a frustoconical shape. Here, as illustrated in state (1) of FIG. 4, an outer edge portion of the upper surface, that is, of one end surface side at the small diameter side, of the SiC single crystal ingot 80 having a frustoconical shape is subjected to cylindrical grinding processing, so that a predetermined height at the upper surface side of the SiC single crystal ingot 80 is made into a cylindrical shape. Hereinafter, a part to be made into a cylindrical shape at this time is referred to as a first cylindrical column part 81.

The height of the first cylindrical column part 81 at this time may be arbitrary but is a fraction of the height of a part used to obtain the SiC wafer in the SiC single crystal ingot 80. For example, the height is ⅓ for three-stage processing and ⅕ for five-stage processing. For example, when the height of a part usable for obtaining a SiC wafer in the SiC single crystal ingot 80 is 60 mm, the height of the first cylindrical column part 81 is 20 mm for three-stage processing, and the height of the first cylindrical column part 81 is 12 mm for five-stage processing. Also, the diameter of the first cylindrical column part 81 can be optionally adjusted. However, since a portion to be cut out by cylindrical grinding processing is a thin range in the outer edge portion where a defect can exist, the diameter is preferably roughly equal to the diameter of the upper surface of the SiC single crystal ingot 80, for example, 6 inches.

Subsequently, the first slicing step is performed thereby to sequentially slice the first cylindrical column part 81 with a predetermined thickness from the tip side, and a plurality of SiC wafers 83 are obtained from the first cylindrical column part 81 as in state (2) of FIG. 4. Since the SiC wafers are actually obtained one by one, a state in which a plurality of wafers remains in a superimposed manner as in state (2) of FIG. 4 does not occur. However, a state in which a plurality of wafers are superimposed is illustrated here for reference purposes. Examples of the slicing step include wire slicing and laser slicing. Here, laser slicing, which can slice more thinly and reduce a cut margin that becomes a cut width, is used. Specifically, the first cylindrical column part 81 is sliced into the SiC wafers 83 one by one from its tip side, and the SiC wafers 83 are obtained to a boundary position between the first cylindrical column part 81 and a part of the SiC single crystal ingot 80 which still has a frustoconical shape.

Since there are various techniques for a laser irradiation method, any technique may be used. Here, a laser modification layer is disposed so as to face the side surface of the first cylindrical column part 81 and thereafter moved along the radial direction of the first cylindrical column part 81 while performing laser irradiation at regular intervals. Then, the SiC wafer 83 is peeled by breaking at laser traces disposed at regular intervals through laser irradiation. Accordingly, the SiC wafer 83 can be produced. For example, the thickness of the SiC wafers 83 may be 150 μm. When the height of the first cylindrical column part 81 is 20 mm, and the thickness of the SiC wafer 83 is 150 μm, the number of the SiC wafers 83 that can be obtained is about 105.

It is noted that the thickness of the SiC wafer 83 is not limited and, for example, can be changed depending on an intended use. The thickness can be 30 μm or more and 1,000 μm or less and preferably 50 μm or more and 500 μm or less. In the present embodiment, the thickness of the SiC wafer 83 can be relatively thinned in this manner by using a SiC support substrate 90 described later. As described herein, the thickness of the SiC wafer 83 refers to an average thickness of the SiC wafers 83 and can be measured by laser, a height gauge, a laser displacement meter, a spectroscopic film thickness measurement device or the like.

It is noted that each time one of the SiC wafers 83 is obtained, the upper surface of the remaining part of the first cylindrical column part 81 may be ground to be flattened, and then laser irradiation for obtaining the next SiC wafer 83 may be performed.

Next, as illustrated in state (3) of FIG. 4, the second grinding step is performed to the SiC single crystal ingot 80 being in a state in which the first cylindrical column part 81 indicated by dashed lines has disappeared after the first slicing step. The second grinding step is the same as the first grinding step, except that the inner diameter of the cylindrical grindstone used for cylindrical grinding processing is larger than that in the first grinding step. In brief, the inner diameter of the cylindrical grindstone has a dimension corresponding to the diameter of the upper surface of the remaining SiC single crystal ingot 80. Specifically, the inner diameter of the cylindrical grindstone is increased corresponding to the rate of the increase in the diameter to the height of the SiC single crystal ingot 80 and the number of stages of the multistage processing.

For example, when the inner diameter of the SiC wafer 83 obtained at the upper surface side of the SiC single crystal ingot 80 is 6 inches, and the inner diameter of the SiC wafer 83 obtained at the lower surface side is 8 inches, the inner diameter of the cylindrical grindstone in the second grinding step is 6+(8−6)/(3−1) inches for three-stage processing. Also, the inner diameter of the cylindrical grindstone in the second grinding step is 6+(8−6)/(5−1) inches for five-stage processing. By performing the second grinding step in this manner, a second cylindrical column part 82 having a diameter larger than the first cylindrical column part 81 is obtained.

Then, the second slicing step is performed thereby to sequentially slice the second cylindrical column part 82 with a predetermined thickness from the tip side, and SiC wafers 83 are obtained as in state (4) of FIG. 4. The second slicing step is performed in the same manner as in the first slicing step. By performing such a second slicing step, SiC wafers 83 having a diameter larger than in the first slicing step can be obtained.

Thereafter, the grinding step and the slicing step are repeated a number of times corresponding to the number of stages of multistage processing. Then, cylindrical column parts whose diameters are gradually increased in the repeated grinding step are formed, and the slicing step is thereafter performed. Accordingly, the SiC wafers 83 can be gradually obtained. The inner diameter of the cylindrical grindstone in forming the cylindrical shape part in the grinding step may be determined depending on the number of stages of the grinding step. Specifically, when the number of stages of the multistage processing is n, the amount in inches obtained from the upper surface side of the SiC single crystal ingot 80 is x, and the amount in inches obtained from the lower surface side is y, an inner diameter Rm of the cylindrical grindstone in the m-th stage of the grinding step may be set such that the following formula is satisfied.

$$Rm = x + (m-1) \times (y-x)/(n-1) \quad \text{(Math. 1)}$$

Figure 5:
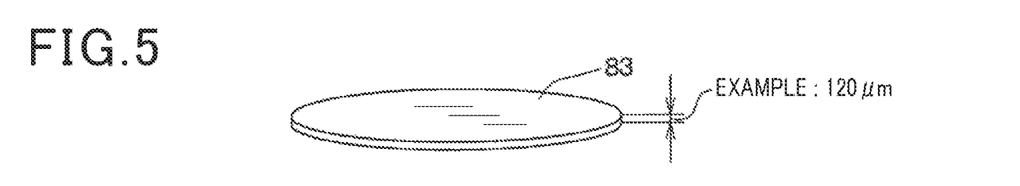
FIG. 5 is a perspective view of a produced SIC wafer.
Figure 6:
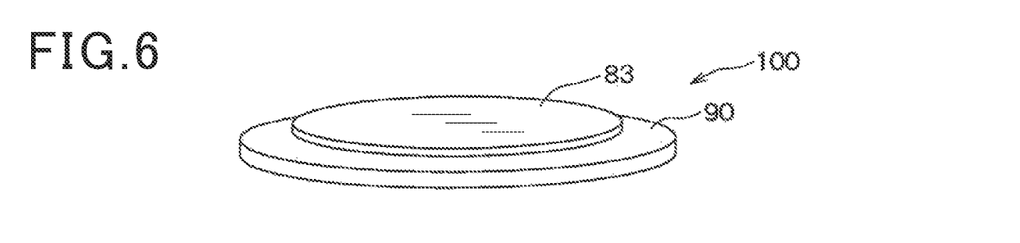
FIG. 6 is a perspective view of a semiconductor substrate configured by adhering a SiC support substrate to a SiC wafer.

In the above-described manner, the SiC wafer 83 having a desired diameter as illustrated in FIG. 5 can be obtained. Thereafter, the obtained SiC wafer 83 is subjected to a back surface adhering step of adhering a SiC support substrate 90 to the back surface of the SiC wafer 83 as illustrated in FIG. 6 to prepare a semiconductor substrate 100. Accordingly, the SiC wafer with the SiC support substrate can be obtained. Here, the back surface adhering step is performed by, for example, directly connecting the SiC support substrate 90 to the back surface of the SiC wafer 83.

The SiC support substrate 90 at this time has an identical diameter regardless of the diameter of the SiC wafer 83. More particularly, the diameter of the SiC support substrate 90 is equal to or larger than the largest diameter of the SiC wafers 83, and is 8 inches in this embodiment.

When all of the SiC support substrates 90 have identical diameters, each process in the subsequent step can be treated as using an identical diameter. Accordingly, even when the SiC wafers 83 have different diameters, an identical facility can be used in the process. Also, material properties of the support substrate are optional. However, there is concern that warpage and stress could occur based on a difference in a linear expansion coefficient between the SiC wafer 83 and the support substrate, when a heat treatment is performed in the subsequent step or when a cooling step is performed after heating. Therefore, the material of the support substrate preferably has a small difference in a linear expansion coefficient with the SiC wafer 83. Especially, when the SiC support substrate 90 constituted by an identical material (regardless of a polycrystal, a crystal orientation, a crystal grade) is used, the problem of the occurrence of warpage and stress can be eliminated as much as possible. Otherwise, other than the SiC support substrate 90, a support substrate of a material having a linear expansion coefficient approximate to SiC may be used.

Also, the thickness of the SiC support substrate 90 is optional. In this embodiment, the thickness is set in consideration of the handling during each treatment and, for example, may be 250 μm or more. As described later, the SiC support substrate 90 is peeled from the SiC wafer 83 after a semiconductor process of creating a semiconductor element in the SiC wafer 83. The peeled SiC support substrate 90 can be reused thereafter. However, a thickness of, for example, about 50 μm of the SiC support substrate 90 is lost during peeled from the SiC wafer 83. Therefore, for enabling recycling multiple times, the thickness of the SiC support substrate 90 is, for example, 500 μm.

It is noted that in consideration of the handling during each treatment, the SiC support substrate 90 can be used until the thickness thereof decreases to, for example, 250 μm. Therefore, one of the SiC support substrate 90 can be reused about five times. Also, the SiC support substrate 90 whose thickness has decreased to less than 250 μm can be further reused, because two of the SiC support substrates 90 can be bonded together to have a thickness of 250 μm or more again.

When the semiconductor substrate 100 including the SiC wafer 83 adhered to the SiC support substrate 90 as illustrated in FIG. 6 is produced in this manner, the surface of the SiC wafer 83 is ground as necessary to flatten the surface of or adjust the film thickness of the SiC wafer 83 for a wafer production. After this wafer production, the thickness of the SiC wafer 83 becomes, for example, 150 μm or less.

Subsequently, although not illustrated, an epilayer obtained by epitaxially growing SiC on the surface of the SiC wafer 83 is formed. Then, in a semiconductor process for producing a semiconductor element such as a vertical MOSFET, a process may be performed on the front surface side of the SiC wafer 83. For example, a step of forming a trench gate structure, a step of forming an interlayer insulating film, and a step of forming a source electrode and a gate wiring disposed at the front surface side may be performed, after forming a p-type base region or an n-type source region by ion injecting n-type impurities or p-type impurities to the surface layer part of the epilayer.

Figure 7:
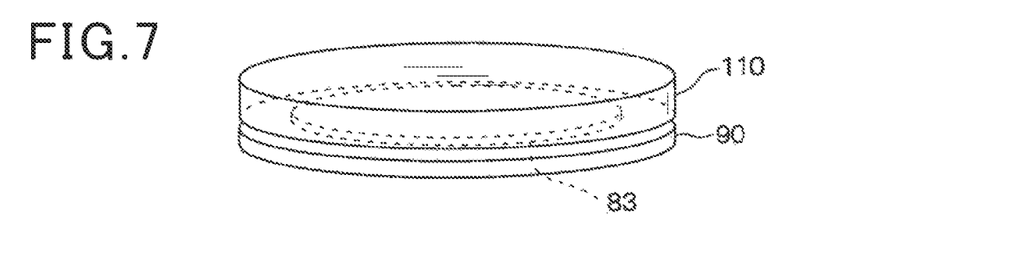
FIG. 7 is a view illustrating a state in which a surface support substrate is adhered to a semiconductor substrate.

Thereafter, as illustrated in FIG. 7, a surface adhering step of adhering a surface support substrate 110 to the front surface side, that is, the SiC wafer 83 side, of the semiconductor substrate 100 via an unillustrated bonding member such as a UV (Ultraviolet) tape is performed. Since a high-temperature process is not performed hereinafter, material properties of the surface support substrate 110 are arbitrary. Here, a glass support substrate is used as the surface support substrate 110. The dimension of the surface support substrate 110 is the same as that of the SiC support substrate 90. If the SiC support substrate 90 diameter is 8 inches, the surface support substrate 110 is also 8 inches, such that processing with an identical facility can be continuously performed.

Figure 8:
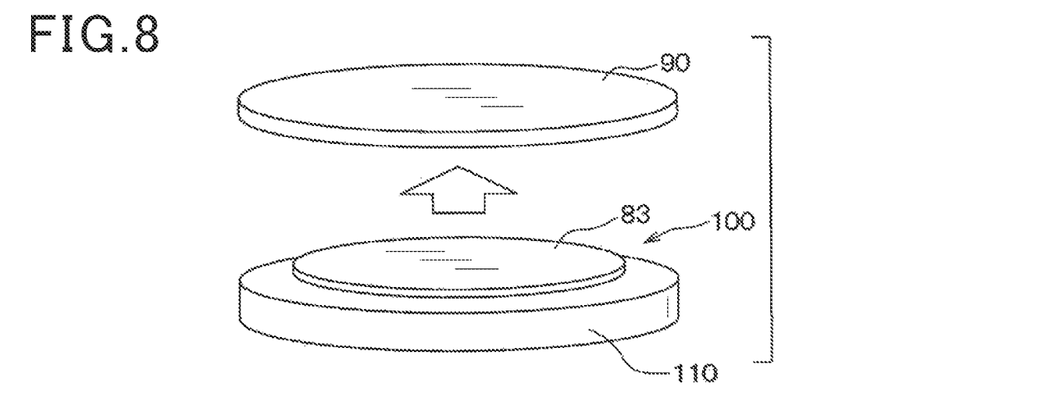
FIG. 8 is a perspective view illustrating a state in which a SiC support substrate is peeled from a SiC wafer in a state in which a surface support substrate is adhered to the SiC wafer.

Furthermore, as illustrated in FIG. 8, the SiC support substrate 90 at the back surface of the semiconductor substrate 100 is peeled in a state in which the semiconductor substrate 100 is supported by the surface support substrate 110. For example, in the same manner as the above-described slicing step, laser irradiation is performed to the surface layer part at the SiC wafer 83 side of the SiC support substrate 90 to form laser traces at certain intervals, and the SiC support substrate 90 is peeled from the SiC wafer 83 by breaking at the laser traces. Thereafter, a figuring step of removing the residue of the SiC support substrate 90 by grinding and polishing processing to flatten and polish the back surface of the SiC wafer 83 is performed. At this time, the back surface of the SiC wafers 83 is removed such that the SiC wafer 83 has a desired thickness.

Figure 9:
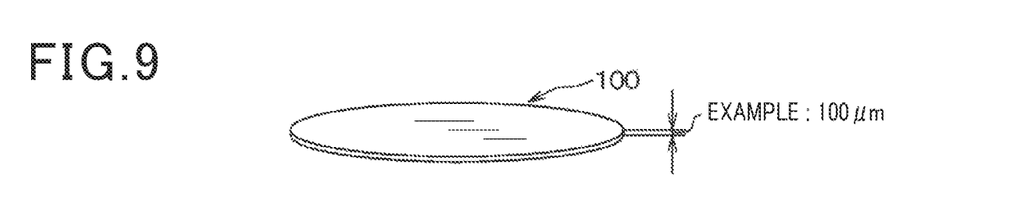
FIG. 9 is a perspective view of a semiconductor substrate after a surface support substrate has been peeled away.

Thereafter, a step of forming a drain electrode to serve as a back surface electrode on the back surface side of the semiconductor substrate 100 in a state in which the SiC wafer 83 is supported by the surface support substrate 110 is performed thereby to complete a semiconductor element. Then, as illustrated in FIG. 9, the surface support substrate 110 is peeled from the semiconductor substrate 100. For example, when a UV tape is used as a bonding member, UV irradiation can be performed thereby to peel the surface support substrate 110 from the surface of the semiconductor substrate 100. At this time, the thickness of the semiconductor substrate 100 is, for example, about 100 μm.

Figure 10:
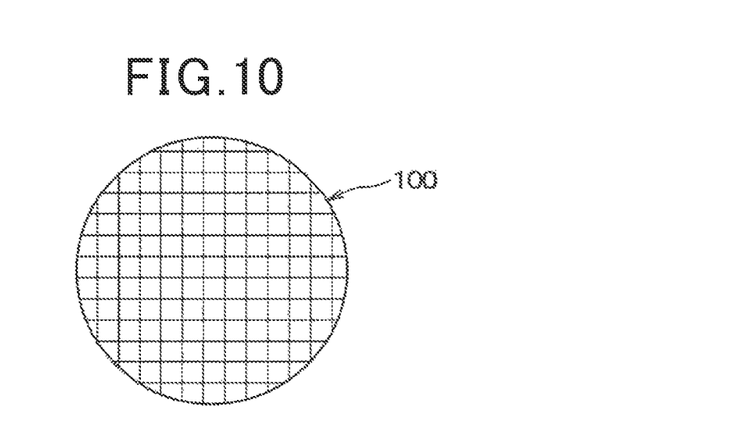
FIG. 10 is a view illustrating a semiconductor substrate diced into pieces.

Finally, as illustrated in FIG. 10, the SiC wafer 83 is diced using a dicing device to separate the semiconductor element into pieces. In this manner, a semiconductor chip to constitute a semiconductor device can be produced.

As described above, in the present embodiment, the grinding step and the slicing step are repeated multiple times. When cylindrical grinding processing is performed in the grinding step to form cylindrical column parts from the SiC single crystal ingot 80, the diameters of the cylindrical column parts are gradually changed. Specifically, the SiC single crystal ingot 80 configured to have a frustoconical shape is made to, instead of cylindrical column parts all having identical diameters, cylindrical column parts whose diameters are increased from the upper surface toward the lower surface of the SiC single crystal ingot 80. Therefore, the ratio usable as the SiC wafer 83 in the SiC single crystal ingot 80, that is, the usage efficiency of a SiC material, can be increased. Thus, the yield of the SiC wafer 83 which can be prepared from the produced SiC single crystal ingot 80 can be increased. Furthermore, since the diameters of the SiC wafers 83 can be gradually increased, the effective area in the SiC wafer 83 where a semiconductor element can be formed can be widened. This can also increase the product yield of the semiconductor chip.

Therefore, there can be achieved the production method of the SiC wafer 83, the production method of the semiconductor substrate, and the production method of the SiC semiconductor device, which can increase the yield of the SiC wafer 83 or the product yield of the semiconductor chip that can be prepared from the produced SiC single crystal ingot 80.

Specifically, with reference to Comparative Examples, a difference in the usage efficiency of a SiC material between the production method of the SiC wafers 83 according to the present embodiment and Comparative Examples will be described. Comparative Example 1 is an example in which the SiC single crystal ingot 80 is collectively made into a cylindrical shape, and the SiC wafer 83 is obtained by the slicing step with a wire. Comparative Example 2 is an example in which the SiC single crystal ingot 80 is collectively made into a cylindrical shape, and the SiC wafer 83 is obtained by the slicing step with laser irradiation.

Figure 11:
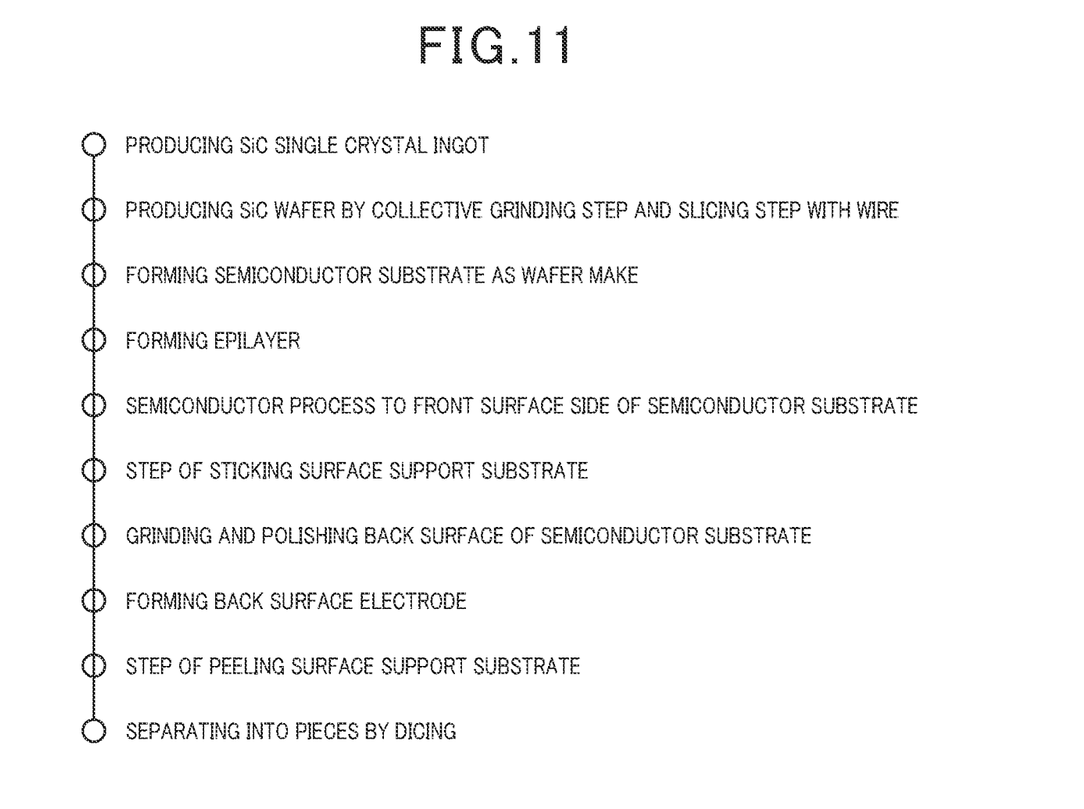
FIG. 11 is a flowchart illustrating a production process of a semiconductor device of Comparative Example 1.
Figure 12A:
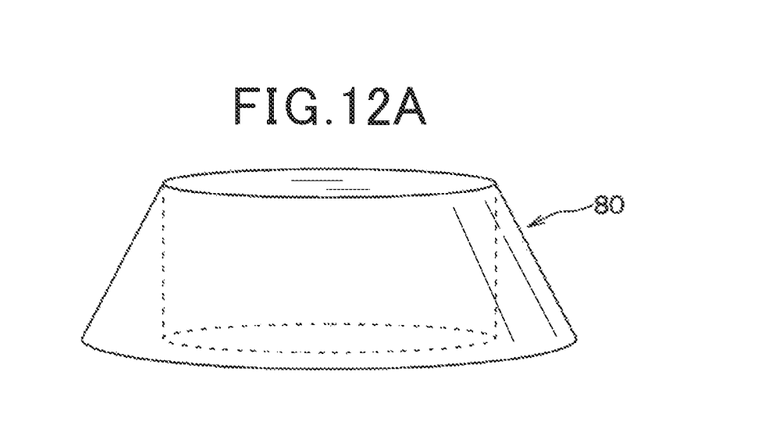
FIG. 12A is a view illustrating a state when a SiC single crystal ingot having a frustoconical shape is collectively subjected to cylindrical grinding processing into a cylindrical shape.
Figure 12B:
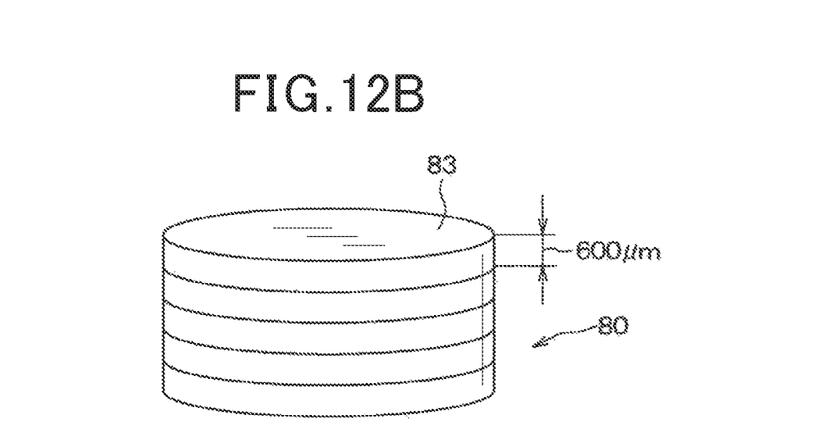
FIG. 12B is a view illustrating a state when a SiC single crystal ingot formed in a cylindrical shape is sliced with a wire.

In Comparative Example 1, as illustrated in FIG. 11 and FIG. 12A, the SiC single crystal ingot 80 is made into a cylindrical shape by preparing the SiC single crystal ingot 80 and thereafter collectively performing cylindrical grinding processing on the outer edge portion of the SiC single crystal ingot 80 by performing the grinding step with a cylindrical grindstone once. Then, as illustrated in FIG. 12B, the slicing step with a wire is performed to obtain the SiC wafer 83. At this time, the thickness of the SiC wafer 83 is about 600 μm, in consideration of the distortion of the SiC wafer 83 due to an interval of a wire and deformation of a wire and the handling in the subsequent step. Therefore, for the SiC single crystal ingot 80 in which the height of a part usable for obtaining the SiC wafer 83 is about 50 to 80 mm, the number of the SiC wafers 83 that can be produced is as small as 83 in Comparative Example 1.

Figure 12C:
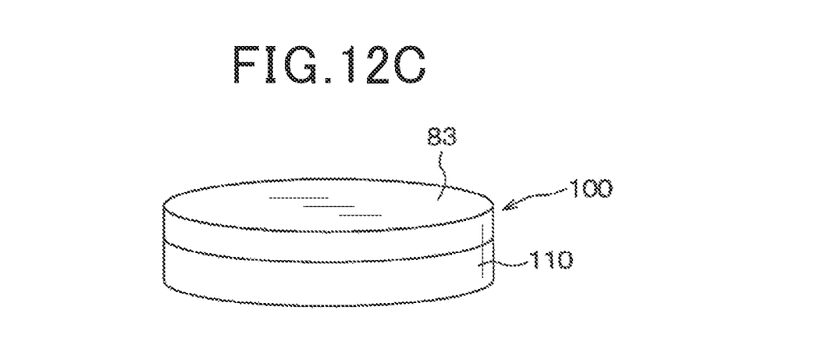
FIG. 12C is a perspective view illustrating a state in which a SiC wafer obtained by slicing with a wire is adhered to a surface support substrate.

Subsequently, a wafer production is performed by flattening the surface of and adjusting the film thickness of the SiC wafer 83. At this time, the semiconductor substrate 100 is constituted by only the SiC wafer 83. Therefore, the thickness of the SiC wafer 83 is increased and may be, for example, 350 μm. Thereafter, in the same manner as in the present embodiment, formation of an epilayer through epitaxial growth and a process performed on the front surface side of the SiC wafer 83 in a semiconductor process for forming a semiconductor element are performed, and bonding with the surface support substrate 110 as illustrated in FIG. 12C is thereafter performed. Also, in Comparative Example 1, the SiC support substrate 90 as in the present embodiment is not used. Therefore, peeling of the SiC support substrate 90 is not performed. However, flattening and polishing of the back surface of the SiC wafer 83 and a step of forming a drain electrode on the back surface side of the semiconductor substrate 100 are thereafter performed, in the same manner as in the present embodiment. Furthermore, peeling of the surface support substrate 110 and separation into pieces by dicing are performed. Accordingly, a semiconductor chip to constitute a semiconductor device is produced.

In such Comparative Example 1, the outer edge portion of the SiC single crystal ingot 80 is collectively removed through cylindrical grinding processing by performing the grinding step with a cylindrical grindstone to the SiC single crystal ingot 80 once. Accordingly, the removed area of the outer edge portion of the SiC single crystal ingot 80 is wider compared to the present embodiment. This lowers the usage efficiency of the SiC material and decreases the yield of the SiC wafer 83 and the yield of the semiconductor chip which can be prepared from the produced SiC single crystal ingot 80.

Also, since the slicing step is performed with a wire, the thickness of the SiC wafer 83 needs to be thick. Furthermore, since the semiconductor substrate 100 is constituted by only the SiC wafer 83, the thickness after a wafer production also needs to be thick such that handling with only the SiC wafer 83 is enabled. This further lowers the yield of the SiC wafer 83 and the yield of the semiconductor chip which can be prepared from the produced SiC single crystal ingot 80. According to the result of the prototype, the SiC wafer 83 cut out from the SiC support substrate 90 was 600 μm while the thickness of the semiconductor substrate 100 after being peeled from the surface support substrate 110 was 100 μm, demonstrating that a thickness of about 500 μm of the SiC wafer 83 had been lost. The yield of the SiC wafer 83 which can be prepared from the produced SiC single crystal ingot 80 was checked. The result was a value as low as about 17%.

Figure 13:
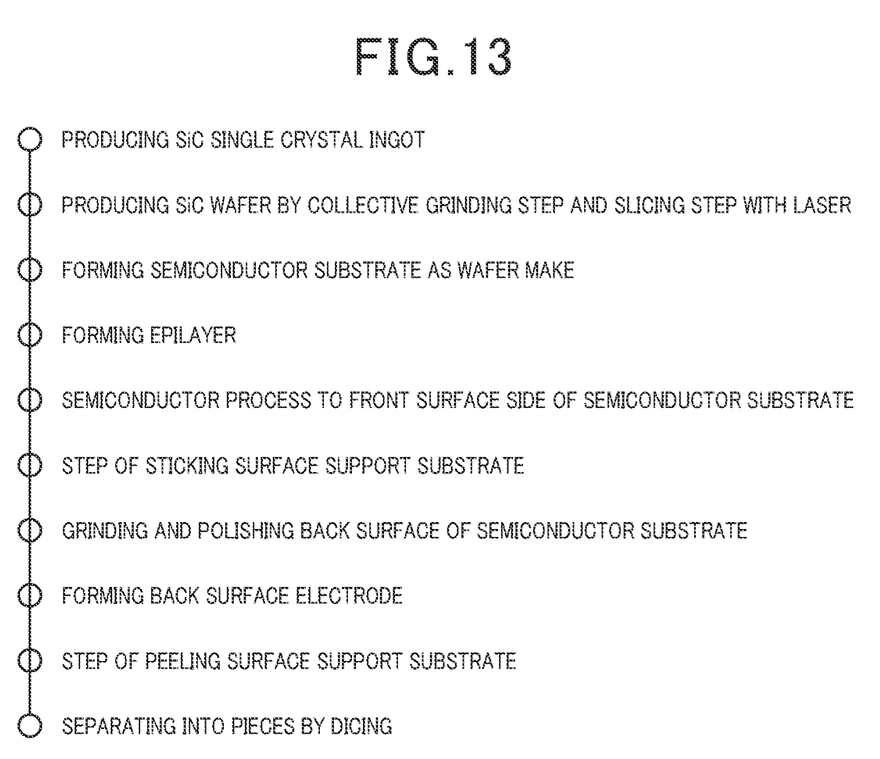
FIG. 13 is a flowchart illustrating a production process of a semiconductor device of Comparative Example 2.
Figure 14:
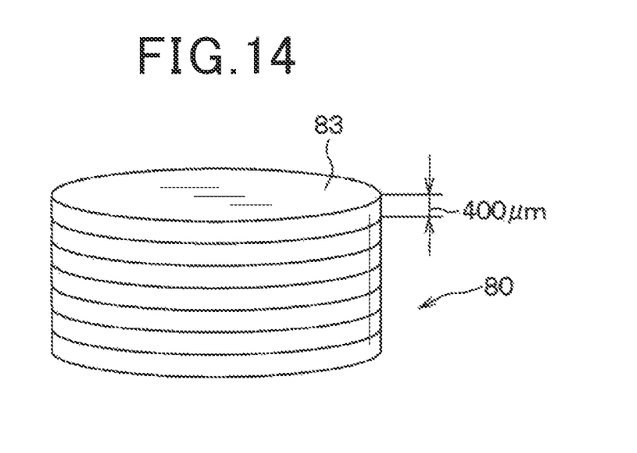
FIG. 14 is a view illustrating a state when a SiC single crystal ingot having a frustoconical shape is collectively formed into cylindrical shapes and further sliced by laser irradiation.

Also, in Comparative Example 2, as illustrated in FIG. 13, the SiC single crystal ingot 80 is made into a cylindrical shape by preparing the SiC single crystal ingot 80 and thereafter collectively performing cylindrical grinding processing on the outer edge portion of the SiC single crystal ingot 80 by performing the grinding step with a cylindrical grindstone once. Then, the slicing step with laser irradiation is performed to obtain the SiC wafer 83. At this time, the thickness of the SiC wafers 83 is about 400 μm as illustrated in FIG. 14, in consideration of handling in the subsequent step. Therefore, for the SIC single crystal ingot 80 in which the height of a part usable for obtaining the SiC wafer 83 is about 50 to 80 mm, the number of the SiC wafers 83 that can be produced is as small as 130 in Comparative Example 2.

Subsequently, a wafer production is performed by flattening the surface of and adjusting the film thickness of the SiC wafer 83. At this time, the semiconductor substrate 100 is constituted by only the SiC wafer 83. Therefore, the thickness of the SiC wafer 83 is increased and, for example, 350 μm. Thereafter, various steps which are the same as those in Comparative Example 1 are performed to produce a semiconductor chip to constitute a semiconductor device.

In such Comparative Example 2, the outer edge portion of the SiC single crystal ingot 80 is also collectively removed through cylindrical grinding processing by performing the grinding step with a cylindrical grindstone to the SiC single crystal ingot 80 once. Accordingly, the removed area of the outer edge portion of the SiC single crystal ingot 80 is wider compared to the present embodiment. This lowers the usage efficiency of the SiC material and decreases the yield of the SiC wafer 83 and the yield of the semiconductor chip which can be prepared from the produced SiC single crystal ingot 80.

Also, since the semiconductor substrate 100 is constituted by only the SiC wafer 83, the thickness after a wafer production also needs to be thick such that handling with only the SiC wafer 83 is enabled. This further lowers the yield of the SiC wafer 83 and the yield of the semiconductor chip which can be prepared from the produced SiC single crystal ingot 80. According to the result of the prototype, the thickness of the SiC wafer 83 cut out from the SiC support substrate 90 was 400 μm while the thickness of the semiconductor substrate 100 after peeled from the surface support substrate 110 was 100 μm, demonstrating that a thickness of about 300 μm had been lost from the SiC wafer 83. The yield of the SiC wafer 83 which can be prepared from the produced SiC single crystal ingot 80 was checked. The result was a value as low as about 25%.

When the SiC single crystal ingot 80 is collectively made into a cylindrical shape as in Comparative Examples 1 and 2, the usage efficiency of the SiC material is low, and the yield of the SiC wafer 83 and the yield of the semiconductor chip which can be prepared from the produced SiC single crystal ingot 80 decrease. On the other hand, in the present embodiment, the grinding step and the slicing step are repeated multiple times, and the diameters of the cylindrical column parts are gradually changed in performing cylindrical grinding processing in the grinding step to form cylindrical column parts from the SiC single crystal ingot 80. This can increase the usage efficiency of the SiC material and enhance the yield of the SiC wafer 83 and the yield of the semiconductor chip which can be prepared from the produced SiC single crystal ingot 80.

In the present embodiment, prototypes were prepared by three-stage processing and by five-stage processing. According to the results, the SiC wafer 83 cut from the SiC support substrate 90 was 150 μm while the thickness of the semiconductor substrate 100 after being peeled from the surface support substrate 110 was 100 μm, demonstrating that the lost thickness of the SiC wafer 83 was suppressed to only 50 μm. The yield of the SiC wafer 83 which can be prepared from the produced SiC single crystal ingot 80 was checked. The result was a value as high as 61% or more.

Second Embodiment

A second embodiment will be described. The present embodiment is the same as the first embodiment except that the production method of the SiC wafer 83 in the first embodiment was changed. Therefore, only a difference from the first embodiment will be described.

Figure 15:
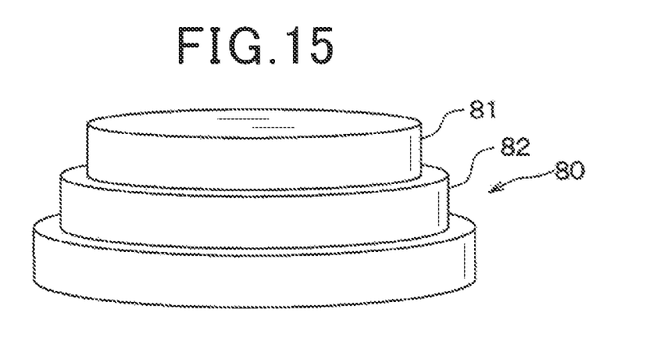
FIG. 15 is a perspective view illustrating a state when the entirety in a height direction of a SiC single crystal ingot is made into cylindrical column parts having different diameters before a slicing step described in a second embodiment.

In the above-described first embodiment, the grinding step and the slicing step were alternately repeated. However, in the present embodiment, the SiC single crystal ingot 80 is firstly subjected to the grinding step to be processed into such a shape that a plurality of cylindrical column parts having different diameters are vertically connected as illustrated in FIG. 15. For example, the structure illustrated in FIG. 15 can be obtained by sequentially performing grinding processing from the upper surface side of the SiC single crystal ingot 80 using a plurality of cylindrical grindstones having different inner diameters. Then, the SiC single crystal ingot 80 having the structure illustrated in FIG. 15 is sequentially subjected to the slicing step, for example, from the cylindrical column part having a smaller diameter, thereby to obtain the SiC wafers 83. This also can provide the same effects as those of the first embodiment.

Modified Examples of First and Second Embodiments

In the above-described first and second embodiments, cylindrical grinding processing is performed from the upper surface side of the SiC single crystal ingot 80 to form a cylindrical column part having a smaller diameter at first and gradually form a cylindrical column part having a larger diameter. However, this is merely an example. The cylindrical grinding processing may be performed from the lower surface side of the SiC single crystal ingot 80 to form a cylindrical column part having a larger diameter at first and gradually form a cylindrical column part having a smaller diameter.

Third Embodiment

A third embodiment will be described. The present embodiment is also the same as the first and second embodiments except that the production method of the SiC wafer 83 in the first and second embodiments was changed. Therefore, only a difference from the first and second embodiments will be described. It is noted that although a case where the present embodiment is applied when the grinding step and the slicing step are alternately performed as in the first embodiment is described as an example here, the present embodiment is also applicable in the same manner to a case where the slicing step is performed after a plurality of cylindrical column parts having different diameters have been formed in the grinding step as in the second embodiment.

Figure 16:
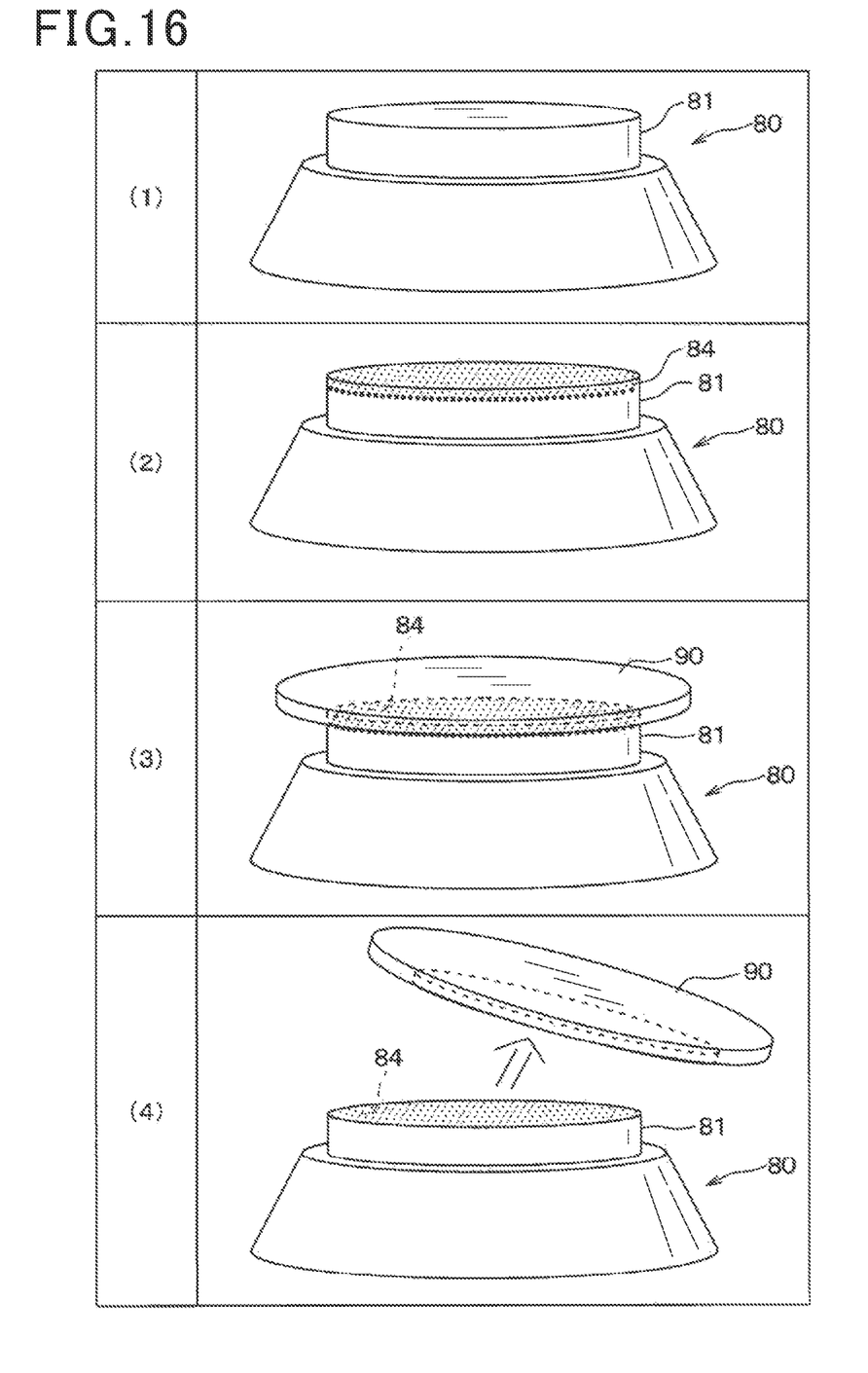
FIG. 16 is a view illustrating a step of adhering a SiC support substrate and peeling a SiC wafer from a SiC single crystal ingot as described in a third embodiment.

First, the first grinding step as described in the first embodiment is performed to form the first cylindrical column part 81, and the slicing step is thereafter performed. At this time, the SiC wafer 83 is peeled by performing laser irradiation and then breaking at the laser traces. The peeled SiC wafer 83 is as thin as about 150 μm. Therefore, there is concern that the SiC wafer 83 could be broken during peeling.

To address this concern, the first cylindrical column part 81 is formed as illustrated in state (1) of FIG. 16, and laser traces are thereafter formed by laser irradiation as illustrated in state (2) of FIG. 16. Then, as illustrated in state (3) of FIG. 16, the SiC support substrate 90 is directly bonded to a surface of the SiC single crystal ingot 80 at a side from which the SiC wafer 83 is obtained, before peeling. Thereafter, as illustrated in state (4) of FIG. 16, the SiC wafer 83 is obtained by breaking at the laser traces.

This can prevent an excessively thin SiC wafer 83 from being obtained and inhibit the SiC wafer 83 from breaking during the slicing step.

Modified Example of Third Embodiment

In the above-described third embodiment, the SIC support substrate 90 is directly bonded to a surface of the SiC single crystal ingot 80 at a side from which the SiC wafer 83 is obtained, before peeling after laser irradiation. However, this order may be reversed. That is, the SiC support substrate 90 may be directly bonded to a surface of the SiC single crystal ingot 80 at a side from which the SiC wafer 83 is obtained before peeling, and laser irradiation may be thereafter performed to form laser traces so that the SiC wafer 83 is obtained by breaking at the laser traces.

Other Embodiments

The present disclosure has been described in accordance with the above-described embodiments. However, the present disclosure is not limited to the embodiments and encompasses various modified examples and modifications within the equivalent range. In addition, various combinations and modes, and furthermore, other combinations and modes which include only one element, more than that, or less than that, of the various combinations or modes also fall within the category and conceptual scope of the present disclosure.

For example, three-stage processing and five-stage processing have been described as examples of multistage processing in the above-described embodiments. However, the number of stages of multistage processing is not particularly limited, as long as it is two or more. However, the fewer the number of stages, the lower the usage efficiency of a SiC material. Therefore, the number of stages is preferably reasonably large. Conversely, when the number of stages is excessively large, the number of facilities for grinding such as cylindrical grindstones to be prepared increases. Therefore, the number of stages is preferably suppressed to a certain number of stages. In consideration of the above, three to five stages, for example, are preferable.

Also, in the above-described embodiments, the cylindrical column part is formed to the SiC single crystal ingot 80 in the grinding step, and the slicing step is thereafter performed without cutting the formed cylindrical column part away from the remaining part of the SiC single crystal ingot 80. However, this is also merely an example. The cylindrical column part may be cut away from the remaining part of the SiC single crystal ingot 80 each time it is formed, and then the slicing step may be performed.

Figure 17:
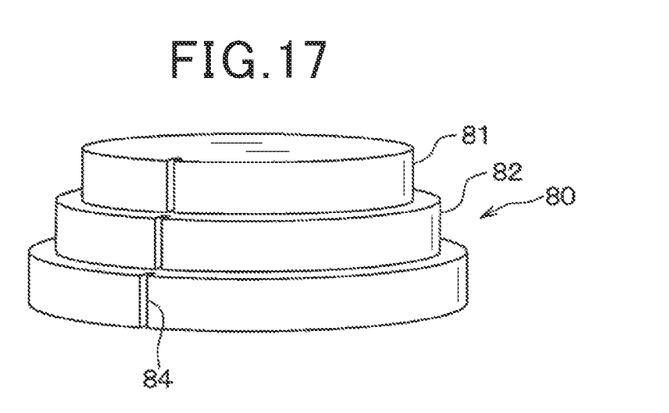
FIG. 17 is a perspective view illustrating a state when markings such as notches have been formed as outer circumferential cutout portions on a SiC single crystal ingot as described in another embodiment.

It is noted that when the cylindrical column part is cut away from the remaining part of the SiC single crystal ingot 80 each time it is formed, and then the slicing step is performed, the slicing step can be performed in a state of being cut away from the remaining part of the SiC single crystal ingot 80 during the slicing step. Therefore, the slicing step is merely performed to the cylindrical shape part, and the remaining part of the SiC single crystal ingot 80 can be prevented from interfering during the slicing step. Conversely, when a plurality of cylindrical column parts is formed from the upper surface to the lower surface of the SIC single crystal ingot 80, and the formed cylindrical column parts are thereafter not cut away and remain unified, notches to serve as outer circumferential cutout portions and orientation flats can be formed at once at the outer circumferential positions of the cylindrical column parts. For example, as illustrated in FIG. 17, outer circumferential cutout portions 84 constituted by notches can be formed at once at identical positions on the outer circumferential positions of the cylindrical column parts of the SiC single crystal ingot 80. Then, the slicing step can be performed after notches and orientation flats have been formed. This can facilitate the formation of notches and orientation flats.

Also, in the above-described embodiments, a case where the slicing step is performed each time a cylindrical column part is formed to the SiC single crystal ingot 80 or after all cylindrical column parts have been formed has been described as an example. This is also merely an example. The slicing step may be performed after multiple stages of cylindrical column parts from be formed to the SiC single crystal ingot 80 have been partly formed, and the remaining SiC single crystal ingot 80 may be thereafter subjected to grinding processing to form a cylindrical column part.

Furthermore, in the above-described embodiments, the grinding step for grinding the SiC single crystal ingot 80 into a plurality of stages of cylindrical column parts has been performed for each stage. However, it may be performed for multiple stages using a staged cylindrical grindstone as a cylindrical grindstone. Also, the technique is not limited to grinding the outer edge portion of the SiC single crystal ingot 80 using a cylindrical grindstone and may include removing the outer edge portion of the SiC single crystal ingot 80 by pressing a grindstone against the side surface of the SiC single crystal ingot 80 to form a cylindrical column part.

What is claimed is:

1. A production method of a silicon carbide wafer to produce a silicon carbide wafer by slicing a silicon carbide single crystal ingot, comprising:

preparing the silicon carbide single crystal ingot having a frustoconical shape which includes an upper surface and a lower surface with a diameter larger than the upper surface;

forming a plurality of stages of cylindrical column parts having different diameters which increase from the upper surface toward the lower surface by removing an outer edge portion of the silicon carbide single crystal ingot having the frustoconical shape through grinding processing of the silicon carbide single crystal ingot; and slicing the cylindrical column part into the silicon carbide wafer.

2. The production method of a silicon carbide wafer according to claim 1, wherein the forming cylindrical column parts and the slicing are alternately repeated; and the plurality of stages of the cylindrical column parts are partly formed, and slicing the formed cylindrical column part is thereafter performed.

3. The production method of a silicon carbide wafer according to claim 1, wherein a plurality of stages of the cylindrical column parts are formed from the upper surface to the lower surface of the silicon carbide single crystal ingot by forming the cylindrical column parts, and slicing the cylindrical column part is thereafter performed while the plurality of stages of the cylindrical column parts remains unified.

4. The production method of a silicon carbide wafer according to claim 3, comprising forming the plurality of stages of cylindrical column parts, and thereafter forming notches or orientation flats at identical positions on outer circumferential positions of the plurality of stages of cylindrical column parts while the plurality of stages of the cylindrical column parts remains unified.

5. The production method of a silicon carbide wafer according to claim 1, wherein in forming the cylindrical column parts, the number of stages of a plurality of the cylindrical column parts is any of 3 to 5.

6. A production method of a semiconductor substrate to produce a semiconductor substrate using the production method of a silicon carbide wafer according to claim 1, comprising:

adhering a support substrate onto a surface of the cylindrical column part from which the silicon carbide wafer is to be obtained by the slicing, after the forming cylindrical column parts; and obtaining the silicon carbide wafer by performing the slicing in a state of being supported by the support substrate, after the adhesion to the support substrate.

7. A production method of a semiconductor substrate to produce a semiconductor substrate using the production method of a silicon carbide wafer according to claim 1, wherein the slicing includes forming laser traces by performing laser irradiation to the cylindrical column part and removing the silicon carbide wafer by breaking the cylindrical column part at the laser traces, and the method further comprising:

adhering a support substrate onto a surface of the cylindrical column part from which the silicon carbide wafer is to be obtained by the slicing after forming the cylindrical column parts and before forming the laser traces; and obtaining the silicon carbide wafer by breaking the cylindrical column part at the laser traces in a state where the cylindrical column part being supported by the support substrate after the adhesion to the support substrate.

8. The production method of a semiconductor substrate according to claim 6, wherein the support substrate is a silicon carbide support substrate.

9. The production method of a semiconductor substrate according to claim 6,

Wherein, in the adhesion of the support substrate, the support substrate having an identical diameter to that used when the silicon carbide wafer is obtained by slicing any stage of the cylindrical column part of the plurality of stages of cylindrical column parts is used.

10. A production method of a semiconductor device to produce a semiconductor device using the semiconductor substrate formed by the production method of a semiconductor substrate according to claim 9, comprising:

preparing the semiconductor substrate in which the silicon carbide wafer is supported by the support substrate; and forming a semiconductor element by performing a semiconductor process on the semiconductor substrate, wherein in forming the semiconductor element, the semiconductor process using an identical facility is also performed on the silicon carbide wafers having different diameters obtained by slicing any stage of the cylindrical column part of the plurality of stages of cylindrical column parts.

* * * * *